(12) United States Patent
Park et al.

(10) Patent No.: US 8,569,164 B2
(45) Date of Patent: Oct. 29, 2013

(54) THROUGH SUBSTRATE STRUCTURE, DEVICE PACKAGE HAVING THE SAME, AND METHODS FOR MANUFACTURING THE SAME

(75) Inventors: Jae Hyoung Park, Gyeonggi-do (KR); Seung Ki Lee, Seoul (KR); Ju Yong Lee, Incheon (KR)

(73) Assignee: Industry-Academic Cooperation Foundation, Dankook University, Gyeonggi-do (KR)

( * ) Notice: Subject to any disclaimer, the term of this patent is extended or adjusted under 35 U.S.C. 154(b) by 85 days.

(21) Appl. No.: 13/298,422

(22) Filed: Nov. 17, 2011

(65) Prior Publication Data

US 2012/0217648 A1    Aug. 30, 2012

(30) Foreign Application Priority Data

Feb. 24, 2011  (KR) ........................ 10-2011-0016618
Oct. 21, 2011  (KR) ........................ 10-2011-0107880

(51) Int. Cl.
*H01L 21/4763*     (2006.01)

(52) U.S. Cl.
USPC ........... 438/620; 438/239; 438/242; 438/612; 438/622; 438/624; 257/E21.303

(58) Field of Classification Search
None
See application file for complete search history.

(56) References Cited

U.S. PATENT DOCUMENTS

2007/0023912 A1*  2/2007  Wang ........................... 257/750

\* cited by examiner

*Primary Examiner* — Kyoung Lee
(74) *Attorney, Agent, or Firm* — Osha Liang LLP (57) ABSTRACT

A through substrate structure, an electronic device package using the same, and methods for manufacturing the same are disclosed. First, a via hole pattern is formed by etching an upper surface of a first substrate. A pattern layer of a second substrate is formed on the first substrate by filling the via hole pattern with a material for the second substrate by reflow. A via hole pattern is formed in the pattern layer of the second substrate by patterning the upper surface of the first substrate. Moreover, a via plug filling the via hole pattern is formed by a plating process, for example, thereby forming a through substrate structure, which can be used in an electronic device package.

6 Claims, 7 Drawing Sheets

THROUGH SUBSTRATE STRUCTURE, DEVICE PACKAGE HAVING THE SAME, AND METHODS FOR MANUFACTURING THE SAME

CROSS-REFERENCE TO RELATED APPLICATIONS

This application claims the benefit of Korean Patent Application No. 10-2011-0016618 filed on Feb. 24, 2011 and 10-2011-0107880 filed on Oct. 21, 2011, in the Korean Intellectual Property Office, the disclosure of which is incorporated herein in its entirety by reference.

BACKGROUND OF INVENTION

1. Field of the Invention

The present invention relates to a through substrate structure and, more particularly, to a through substrate structure, a device package having the same, and methods for manufacturing the same.

2. Description of the Related Art

Recently, a vertical through connection structure in a substrate has been applied to various electronic or mechanical device packages. Research on how to form the vertical through connection structure in the substrate is conducted mainly using a silicon wafer that facilitates the formation of a vertical structure with a high aspect ratio. Typically, a process of forming a through structure with a high aspect ratio is required to reduce the size of the device and implement a high density. To this end, a deep reactive ion etching (DRIE) technique using laser or ICP equipment or a wet etching technique using a potassium hydroxide (KOH) solution is used. The laser-assisted process is a method for forming a through structure by irradiating a laser beam directly onto the surface of a silicon wafer, thereby forming a via hole of a desired size within a short time in which, however, the entrance and the inner surface of the thus formed via hole may not be smooth. Moreover, in the case of wet etching, a via hole with an inclined surface is formed along a silicon crystal surface, and thus it is very difficult to form a high density vertical through structure.

The DRIE technique can provide a high aspect ratio and a smooth surface and thus is widely used. However, voids are more likely to be formed when metal or amorphous silicon for electrical conduction is deposited in the via hole, and thus the uniformity of electrical resistance in a vertical through electrode is reduced, which is problematic. Moreover, since the silicon is deposited around a signal line, a process of forming an insulating layer, a diffusion barrier layer, and a seed layer should be performed before filing a conductive metal material in a via hole formed in a silicon wafer. However, according to the above process, many materials are deposited for signal isolation, and thus the process is very complicated, which leads to waste of time and cost, thus requiring improvement. Moreover, although an insulating film is provided, the loss of signal is significantly increased by the silicon around the signal line when applied to high frequency devices such as RF devices. That is, it can be said that the DRIE technique is not suitable for a substrate connection structure that requires high insulating performance.

As an example of another RF MEMS device packaging technique using a vertical through connection structure, a packaging technique using ceramic materials such as low temperature co-fired ceramics (LTCC) has been reported. The ceramic materials have excellent high frequency characteristics and have a multilayer structure. Thus, the ceramic materials can be used to form a thin film multilayer circuit on a single substrate and thus are widely used to manufacture high performance, high frequency semiconductor devices. However, ceramic substrates are processed mainly by machining, and thus it is relatively difficult to perform micromachining. Moreover, the ceramic substrates do not have a substrate structure like silicon wafers and thus are not currently used to manufacture micro-devices through a semiconductor process. Even when RF MEMS devices are mounted in a ceramic package, a space for packaging the devices in a large ceramic package is created, and the unit devices are assembled to the ceramic package and connected to signal lines by flip-chip bonding, wire bonding, etc. Thus, it is difficult to perform wafer-level packaging, and the loss of signal transmission and the volume are increased. Further, the Korea Institute of Science and Technology (KIST) has implemented an RF MEMS packaging technique by a simple process in such a manner that a vertical through structure penetrating a glass substrate is formed by sandblasting and a signal line is formed therein by electroplating. However, during the vertical etching by sandblasting, the size of a via hole is increased, the etched surface is roughened, and the internal shape of the via hole is not uniform. Thus, the loss of signal transmission increases as the frequency increases. To this end, it is necessary to provide a vertical through connection structure, a device package having the same, and new and more effective methods for manufacturing the same.

SUMMARY OF INVENTION

The present invention has been made in an effort to solve the above-described problems associated with prior art, and a first object of the present invention is to provide a through substrate structure with a via plug formed in a certain pattern layer.

A second object of the present invention is to provide a method for manufacturing the through substrate structure in accordance with the first objet of the present invention.

A third object of the present invention is to provide an electronic device package using the through substrate structure in accordance with the first objet of the present invention.

A fourth object of the present invention is to provide a method for manufacturing the electronic device package in accordance with the third objet of the present invention.

According to an aspect of the present invention to achieve the first object of the present invention, there is provided a through substrate structure comprising: a first substrate having a projecting edge portion; a second substrate formed of a non-conductive material on the first substrate in an area defined by the edge portion of the first substrate; and a conductive via plug penetrating the second substrate.

According to another aspect of the present invention to achieve the second object of the present invention, there is provided a method for manufacturing a through substrate substructure, the method comprising: forming a first pattern having a concave-convex shape by selectively etching a first substrate; forming a second substrate having a second pattern which fills a space in the first pattern; forming a space in the second pattern by removing a projecting portion of the first pattern of the first substrate; and forming a via plug which fills the space in the second pattern.

According to still another aspect of the present invention to achieve the third object of the present invention, there is provided an electronic device package comprising: a substrate assembly having a through structure of a conductive material; an electronic device disposed on one side of the substrate assembly; a bonding electrode formed on the other side of the substrate assembly and facing the electronic device; and a protective substrate bonded to the substrate assembly and protecting the electronic device from the outside.

According to yet another aspect of the present invention to achieve the fourth object of the present invention, there is provided a method for manufacturing an electronic device package, the method comprising: mounting an electronic device on a through substrate structure including a first substrate, a second substrate disposed on the first substrate, and a via plug penetrating the second substrate; disposing a protecting substrate for protecting the electronic device on the through substrate structure; forming a substrate assembly including the second substrate, the via plug penetrating the second substrate, and the first substrate surrounding the outer side of the second substrate by etching the back side of the first substrate; and forming a bonding electrode electrically connected to the via plug and facing the electronic device with the second substrate interposed therebetween.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF THE INVENTION

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Unless otherwise defined, all terms, including technical and scientific terms, used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Exemplary Embodiment 1

Figure 1:
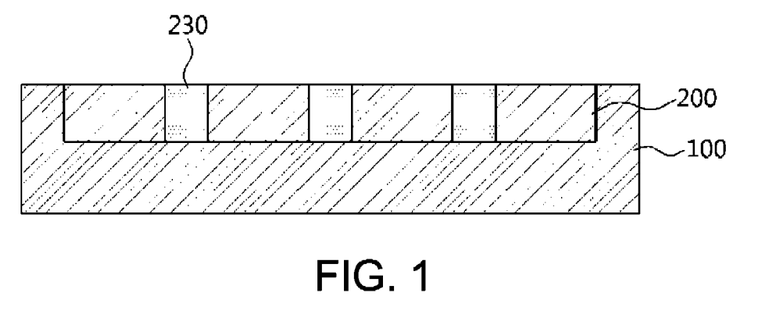
FIG. 1 is a cross-sectional view showing a through substrate structure in accordance with a first exemplary embodiment of the present invention.

FIG. 1 is a cross-sectional view showing a through substrate structure in accordance with a first exemplary embodiment of the present invention.

Referring to FIG. 1, a through substrate structure in accordance with the exemplary embodiment of the present invention comprises a first substrate 100, a second substrate 200, and a via plug 230.

The first substrate 100 is formed of an etchable material, preferably silicon. Moreover, the first substrate 100 may be formed of any material that can be etched and maintain its properties at high temperatures such as sapphire, zinc oxide, etc. The first substrate 100 has a shape in which an edge portion projects from the center and the center is recessed from the edge portion. Thus, the second substrate 200 is disposed in the recessed portion of the first substrate 100.

The second substrate 200 has non-conductive properties and is preferably a glass substrate. Moreover, the second substrate 200 is penetrated by the via plug. The via plug 230 is a conductive metal material and penetrates both sides of the second substrate 200. The via plug 230 may be formed of any metal that is suitable for deposition or plating. Thus, the via plug 230 may be formed of chrome, copper, gold, or multiple layers thereof.

In FIG. 1, the second substrate 200 is received in the recessed portion of the first substrate 100 and has a through structure with a predetermined pattern.

FIGS. 2 to 11 are cross-sectional views showing a method of manufacturing the through substrate structure in accordance with the first exemplary embodiment of the present invention.

Figure 2:
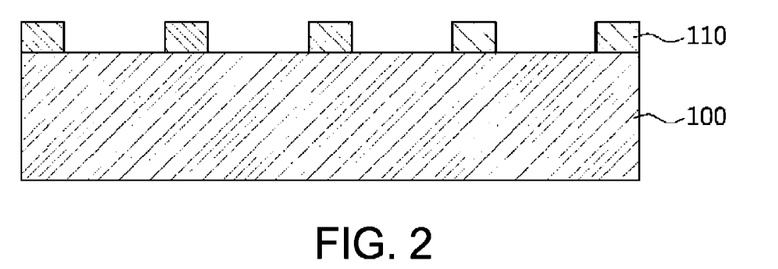
FIGS. 2 to 11 are cross-sectional views showing a method of manufacturing the through substrate structure in accordance with the first exemplary embodiment of the present invention.

Referring to FIG. 2, a first photoresist pattern 110 is formed on a first substrate 100.

The first substrate 100 may be any substrate that is suitable for a typical photoresist process. Thus, the first substrate 100 may preferably be formed of silicon. Moreover, any material that can be etched using a portion of photoresist as an etching mask can be used as the first substrate 100.

First, a photoresist is deposited on the first substrate 100, and the first photoresist pattern 110 is formed by a typical photoresist process.

Figure 3:
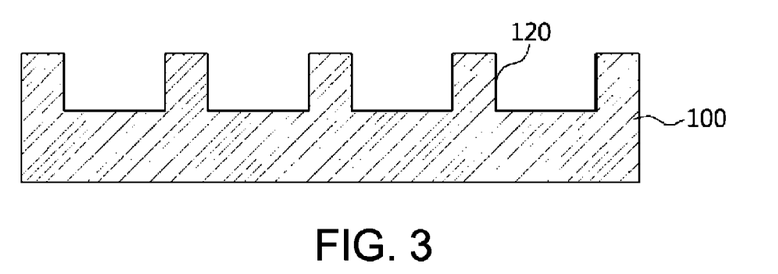

Referring to FIG. 3, the first substrate 100 is etched using the first photoresist pattern 110 as an etching mask. For example, the first substrate 100 may be etched by an anisotropic etching process or a DRIE process. The DRIE process can form a pattern with a high aspect ratio and a smooth etched surface. A first pattern 120 with a concave-convex shape is formed on the surface of the first substrate 100 by etching the first substrate 100 exposed using the first photoresist pattern 110 as an etching mask.

Then, the formed first photoresist pattern 110 is removed.

Figure 4:
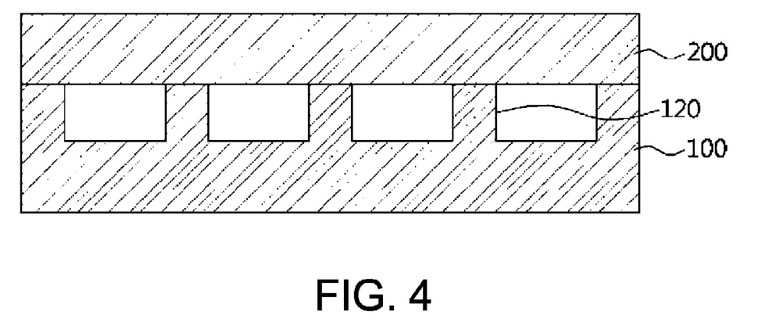

Referring to FIG. 4, a second substrate 200 is disposed on the first substrate 100 on which the first pattern 120 is formed. Preferably, the second substrate 200 is bonded to the first pattern 120 of the first substrate 100. Moreover, the second substrate 200 may be formed of any material that has a melting point lower than that of the first substrate 100 and has non-conductive properties. In particular, the second substrate 200 may preferably be formed of glass that has a melting point lower than that of the first substrate 100 and has reflow properties.

Moreover, the first substrate 100 may be bonded to the second substrate 200 by various methods. For example, when the first substrate 100 is formed of silicon and the second substrate 200 is formed of glass, the bonding of both substrates may be performed by an anodic bonding process. That is, the bonding of the first substrate 100 and the second substrate 200 may be performed by applying a predetermined voltage between the first substrate 100 and the second substrate 200 and applying an external force thereto at a predetermined temperature. For example, the bonding of silicon and glass can be achieved by applying a voltage of about 800 V to the first silicon substrate 100 and the second glass substrate 200 and applying an external force of about 400 N at a temperature of about 380° C. In addition, a fusion process using heat and pressure may be used.

Figure 5:
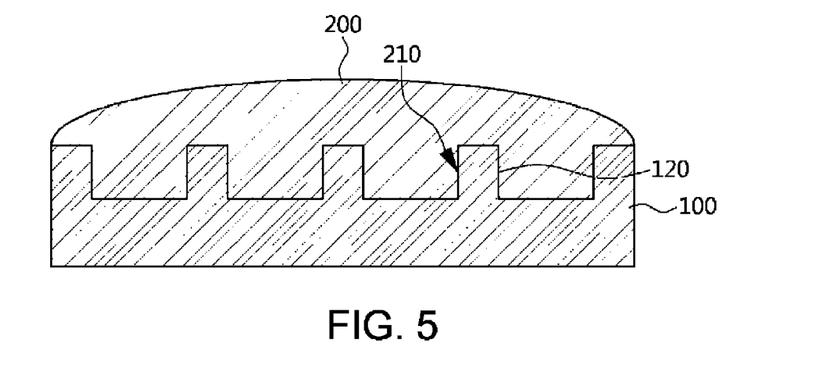

Referring FIG. 5, the second substrate 200 bonded to the first substrate 100 is heated such that a portion of the second substrate 200 is filled in the first pattern 120. Thus, a second pattern 210 of the second substrate 200 corresponding to the first pattern 120 of the first substrate 100 is formed on the first substrate 100. For example, the second glass substrate 200 is heated such that the glass has fluidity. Moreover, the glass with fluidity reflows to the recessed portion of the first pattern 120 of the first substrate 100. The reflow of the glass is performed under vacuum such that the glass melted by heating flows naturally to the inside of the first pattern 120 of the first substrate 100. Moreover, the process of heating the second glass substrate 200 and reflowing the molten glass may be performed through a plurality of steps. For example, in a first step, the temperature is increased from room temperature to about 1,000° C. for about three hours. Then, in a second step, the temperature is maintained at about 1,000° C. for about five hours and, in a third step, the temperature is decreased from about 1,000° C. to room temperature for about three hours.

Figure 6:
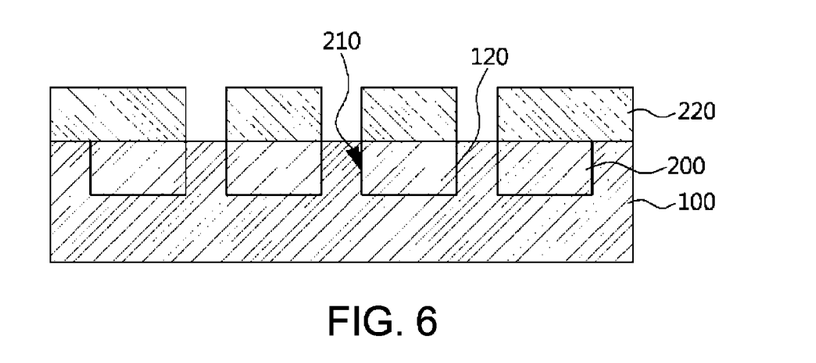

Referring to FIG. 6, a planarization process is performed on the structure shown in FIG. 5. The planarization process is performed on the second substrate 200. Thus, a portion of the top of the second substrate 200 is removed, and the planarization process is continued until the first pattern 120 of the first substrate 100 is exposed. As a result, only a portion of the second substrate 200 that is filled in the first pattern 120 remains. Although it is shown in FIG. 6 that the remaining elements of the second pattern 210 are separated from each other, they just look like that in the cross-sectional view, and it will be shown in a plan view that the remaining second pattern 210 has a continuous shape with a predetermined second pattern 210. That is, the projecting portion of the first pattern 120 of the first substrate 100 has a hole shape, an independent island shape, or a specific wiring shape, and thus the projecting portions of the second pattern 210 of the second substrate 200 may be connected to each other.

The planarization process may be performed by chemical mechanical polishing.

Subsequently, a second photoresist pattern 220 is formed on the planarized structure. The second photoresist pattern 220 is formed to correspond to the second pattern 210 of the second substrate 200 by a typical photoresist process. That is, the second photoresist pattern 220 is formed only on the second substrate 200, which remains after the planarization process, and the edge portion of the first substrate 100, and the projecting portion of the first substrate 100 is exposed through the second photoresist pattern 220.

Figure 7:
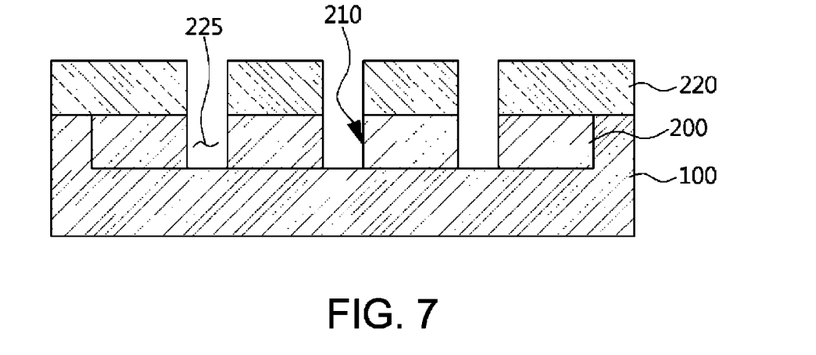

Referring to FIG. 7, an etching process is performed using the thus formed second photoresist pattern 220 as an etching mask. Preferably, the etching process may be an anisotropic dry etching process. Moreover, the first pattern 120 of the first substrate 100 is removed by the etching process. That is, the projecting portion of the first substrate 100 is removed by the etching process, and thus the first substrate 100 has a recessed shape. However, the first substrate 100 may not have a perfect plane depending on the degree of etching Thus, the first substrate 100 may have a substantially horizontal shape through the etching process. Moreover, the edge portion of the first substrate 100 projects from the center through the etching process.

Furthermore, a via hole 225 penetrating the second substrate 200 is formed in the second substrate 200 by the etching process. The via hole 225 is formed by the removal of the projecting portion of the first substrate 100. The recessed plane of the first substrate 100 is exposed through the via hole 225.

Figure 8:
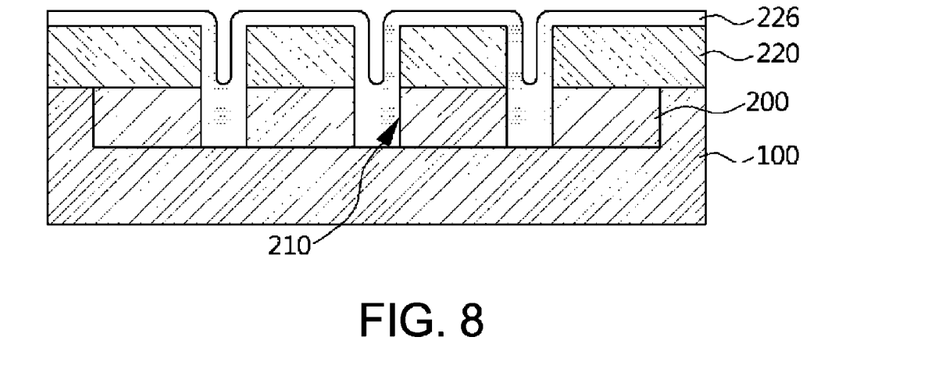

Referring to FIG. 8, a conductive metal material 226 is deposed on the structure shown in FIG. 7.

The deposition of the conductive metal material 226 is performed such that the conductive metal material 226 fills the via hole 225 of the second substrate 200. Thus, the conductive metal material 226 is deposited on the second photoresist pattern 220 and fills the via hole 225 of the second substrate 200.

Figure 9:
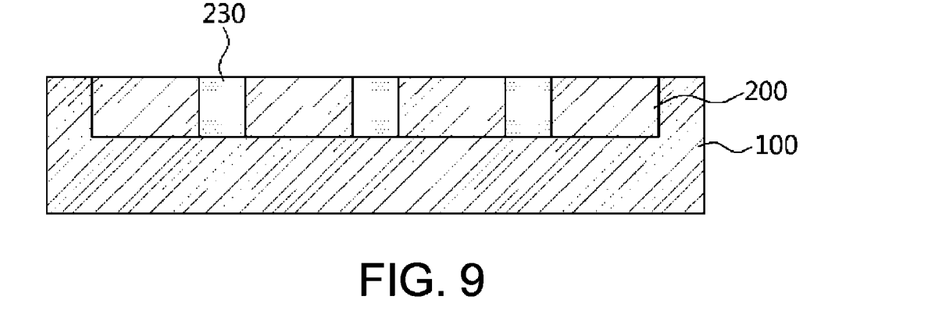

Referring to FIG. 9, a lift-off process of removing the second photoresist pattern 220 of FIG. 8 is performed. The second photoresist pattern 220 is removed by the lift-off process, and the conductive metal material 226 formed on the top and side of the second photoresist pattern 220 is also removed. Accordingly, only the conductive metal material 226 filled in the via hole 225 remains, which will be referred to as a via plug 230. As a result, the via plug 230 comprising the conductive metal material 226 filled in the via hole 225 and penetrating the second substrate 200 is formed by the lift-off process.

Moreover, the conductive metal material 226 filled in the via hole 225 of the second substrate 200 may project from the surface of the second substrate 200 by the lift-off process. A planarization process may be further performed on the via plug 230 projecting from the surface of the second substrate 200. Thus, the via plug 230 may form the same plane as the surface of the second substrate 200.

The via plug 230 penetrating the second substrate 200 has a pattern having the same shape as the first pattern 120 of the first substrate 100 shown in FIG. 3. This is because the via hole 225 of the second substrate 200 is formed by the removal of the projecting portion of the first patterns 120 of the first substrate 100.

The method for forming the through substrate structure by forming the via plug 230 on the second substrate 200 formed of glass, etc. can be achieved by another method.

Figure 10:
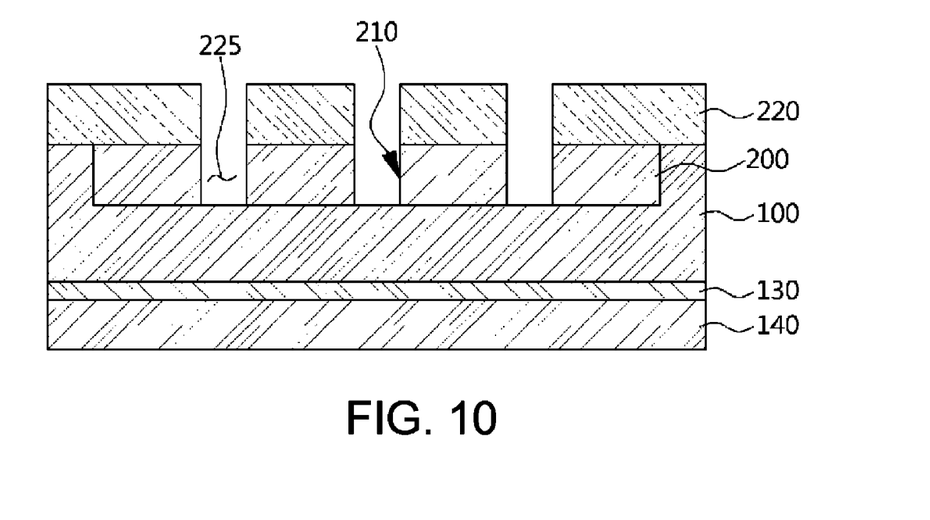

Referring to FIG. 10, a plating electrode layer 130 is formed on the back side of the first substrate 100 in the structure shown in FIG. 7. A protective film 140 for protecting the plating electrode layer 130 may be further formed. The protective film 140 may be an insulating film such as a photoresist or oxide film.

Figure 11:
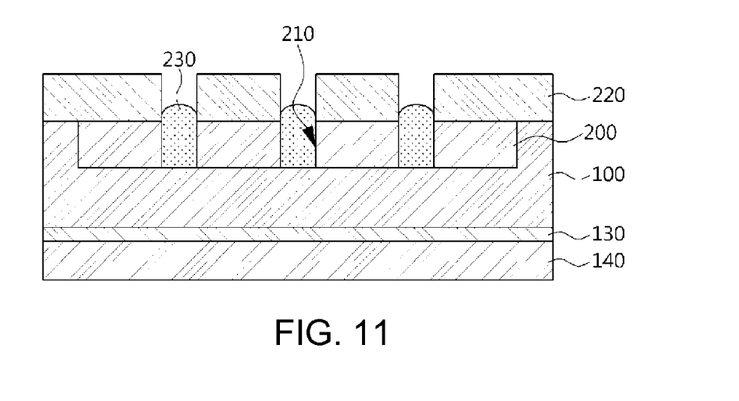

Referring to FIG. 11, a plating process is performed on the structure shown in FIG. 10. In detail, a via plug 230 for filling the via hole 225 of the second substrate 200 is formed by an electroplating process. The protective film 140 functions to prevent the plating electrode layer 130 on the back side of the first substrate 100 from being plated during the electroplating process. To this end, the protective film 140 is preferably formed on an area other than a predetermined area required to supply current during the electroplating process. During the electroplating process, the structure of FIG. 10 is immersed in an electrolyte, and external power is applied thereto such that the current flows from the plating electrode layer 130 to the exposed portion of the first substrate 100. That is, during the electroplating process, when a positive (+) electrode plate is immersed in an electrolyte and a negative (−) electrode is applied to the plating electrode layer 130 on the back side of the first substrate 100, a conductive material is filled in the open space of the first substrate 100 through the plating electrode layer 130 and the via hole 225, thereby forming the via plug 230.

Subsequently, the remaining second photoresist pattern 220 is removed. Moreover, a planarization process may be performed on the via plug 230 which may project from the surface of the second substrate 200, if necessary. The surface of the via plate 230 may form the same plane as the surface of the second substrate 200 by the planarization process.

In the exemplary embodiment of the present invention, the formation of the plating electrode layer 130 and the protective film 140 may be performed before the plating process. Thus, the formation of the plating electrode layer 130 and the protective film 140 may be performed in any one of the steps of FIGS. 2 to 7. Preferably, the formation of the plating electrode layer 130 and the protective film 140 may be performed in the subsequent steps of FIG. 6 after the reflow process of the second substrate 200. The reason for this is that the plating electrode layer 130 or the protective film 140 may be damaged by the high temperature atmosphere created during the reflow process of glass.

Figure 12:
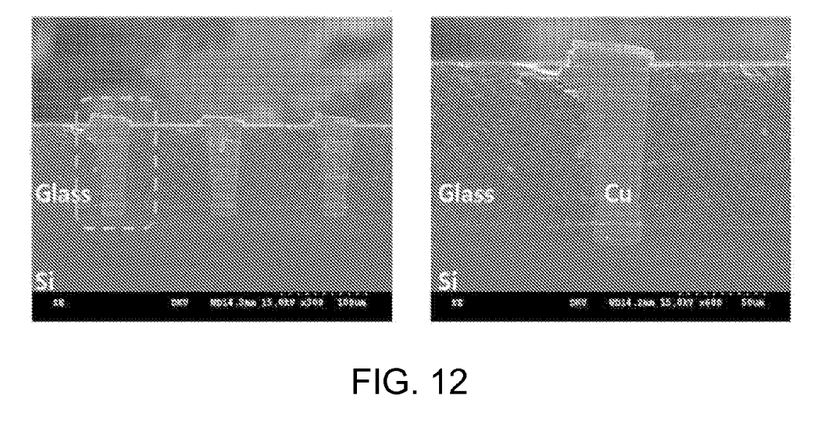
FIG. 12 shows images of the through substrate structure formed in accordance with the first exemplary embodiment of the present invention.

FIG. 12 shows images of the through substrate structure formed in accordance with the first exemplary embodiment of the present invention.

Referring to FIG. 12, the first substrate is formed of silicon and the second substrate is formed of glass. Moreover, the via plug is formed of copper by electroplating. It can be seen that the copper via plug, which fills the via hole formed by the second pattern of the formed glass substrate, is formed without vacancies.

Exemplary Embodiment 2

Figure 13:
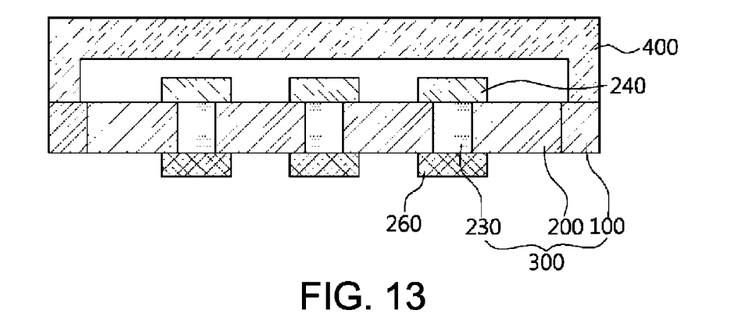
FIG. 13 is a cross-sectional view showing an electronic device package in accordance with a second exemplary embodiment of the present invention.

FIG. 13 is a cross-sectional view showing an electronic device package in accordance with a second exemplary embodiment of the present invention.

Referring to FIG. 13, a substrate assembly 300 is formed by removing a portion of a first substrate 100 from the through substrate structure shown in the first exemplary embodiment of the present invention, and a plurality of electronic devices 240 and bonded electrodes 260 are formed on upper and lower surfaces of a second substrate 200 of the substrate assembly 300. Also, a protective substrate 400 for protecting the bonded electronic devices 240 is prepared.

First, an electronic device package comprises a substrate assembly 300, an electronic device 240, a bonding electrode 260, and a protective substrate 400.

The substrate assembly 300 comprises a first substrate 100, a second substrate 200, and a via plug 230.

The center of the first substrate 100 is removed by a planarization process and only the edge portion of the first substrate 100 remains. Thus, the first substrate 100 is configured to surround the outer side of the second substrate 200. Moreover, the first substrate 100 is bonded to the protective substrate 400.

The electronic device 240 is mounted on the second substrate 200 and electrically connected to the bonding electrode 260 through the via plug 230. Thus, the electronic device 240 of the present exemplary embodiment may be electrically connected to the outside through the bonding electrode 260 formed on the back side of the second substrate 200. The electronic device 240 may be provided as an individual semiconductor chip obtained by dicing or sawing and may be a conductive metal wire or MEMS device.

The protective substrate 400 is connected to the substrate assembly 300. Especially, the protective substrate 400 protects the electronic device 240 mounted on the substrate assembly 300 from the external environment. The protective substrate 400 is formed of a physically or chemically stable material, preferably a material that can be easily bonded to the first substrate 100. Therefore, the protective substrate 400 may be formed of glass, etc.

FIGS. 14 to 21 are cross-sectional views showing a method for manufacturing the device package in accordance with the second exemplary embodiment of the present invention.

Figure 14:
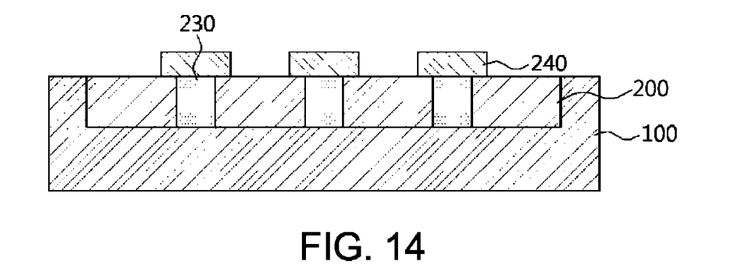
FIGS. 14 to 21 are cross-sectional views showing a method for manufacturing the device package in accordance with the second exemplary embodiment of the present invention.

Referring to FIG. 14, the structure shown in FIG. 1 is first provided and is named a through substrate structure. The through substrate structure has a structure in which a second substrate 200 is disposed on a first substrate 100 and a via hole of the second substrate 200 is filled with a via plug 230.

Subsequently, an electronic device 240 is provided in contact with the via plug 230 on the second substrate 200. The electronic device 240 may be a metal wire or a semiconductor device or MEMS device formed by a semiconductor manufacturing process. Preferably, the electronic device 240 may be electrically connected to the via plug 230.

Especially, the electronic device 240 disposed on the second substrate 200 may be a coplanar waveguide, which means a transmission line provided with a conductor at a certain distance from a ground wire on a single plane.

Figure 15:
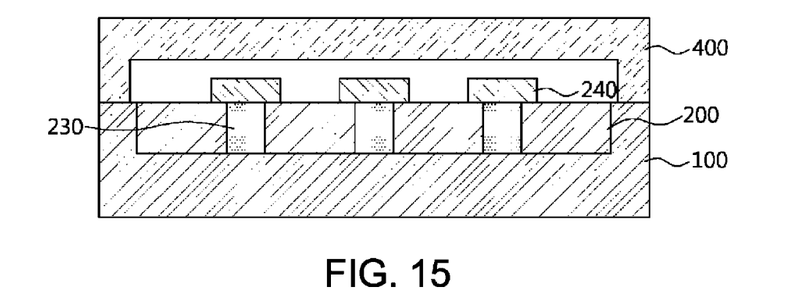

Referring to FIG. 15, a protective substrate 400 is prepared. The protective substrate 400 may be formed of any material that has non-conductive properties. More preferably, the protective substrate 400 may be formed of any material that is suitable for an etching process. For example, the protective substrate 400 may be formed of glass.

The protective substrate 400 has a shape in which the center of one side is recessed. The protective substrate 400 whose one side is recessed may be formed by various methods. For example, the formation of the protective substrate 400 can be achieved by an anisotropic etching process using a metal pattern as an etching mask. In addition, the protective substrate 400 may be configured to fill the top of the substrate assembly 300 with a molding compound, Subsequently, the protective substrate 400 is disposed on the prepared through substrate structure and bonded to the first substrate 100 of the through substrate structure by an anodic bonding process. The anodic bonding process may be performed by applying a voltage between the first substrate 100 formed of silicon and the protective substrate 400 formed of glass and applying an external force thereto at a predetermined temperature. For example, the first silicon substrate 100 and the protective glass substrate 400 may be bonded together by applying a voltage of about 800 V between the first silicon substrate 100 and the protective glass substrate 400 and applying an external force of about 400 N at a temperature of about 380° C.

Otherwise, the first silicon substrate 100 and the protective glass substrate 400 may be bonded using an adhesive.

Figure 16:
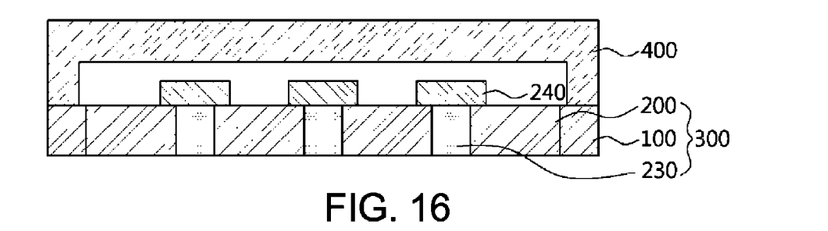

Referring to FIG. 16, the first substrate 100 of the through substrate structure is etched. Thus, most of the first silicon substrate 100 is removed, and only the silicon of the edge portion of the through substrate structure remains. As a result, the back side of the second substrate 200 is exposed.

Moreover, the via plug 230 of the second substrate 200 is exposed by the partial removal of the first substrate 100.

The partial removal of the first substrate 100 can be achieved by a planarization process such as chemical mechanical polishing.

In the case where the plating electrode layer 130 and the protective film 140 for the plating process remain on the back side of the first substrate 100 as shown in FIG. 11 of the first exemplary embodiment, the plating electrode layer 130 and the protective film 140 are removed by the process of FIG. 16.

Through the above-described processes, the substrate assembly 300 comprising the first substrate 100, the second substrate 200, and the via plug 230, in which the second substrate 200 is disposed in the center thereof, the first substrate 100 is provided on the outer side of the second substrate 200, and the via plug 230 penetrates the second substrate 200. The first substrate 100, the second substrate 200, and the via plug 230, which constitute the substrate assembly 300 form the same plane, and the back side of the substrate assembly 300 is exposed to the outside.

Figure 17:
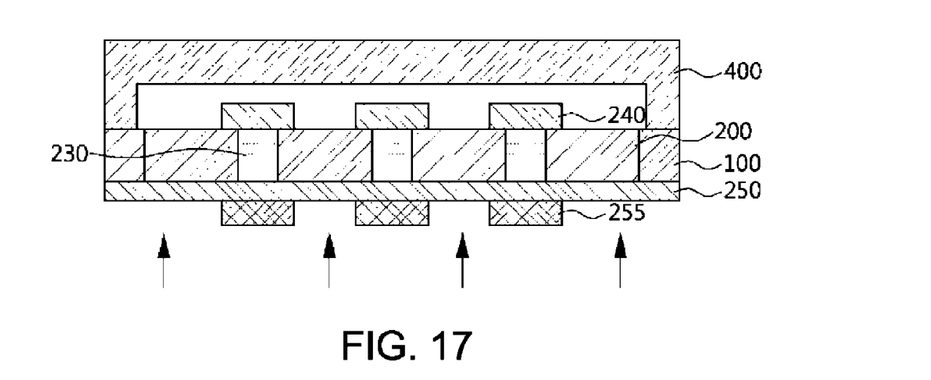

Referring to FIG. 17, a bonding metal layer 250 is formed on the back side of the second substrate 200 exposed by the planarization process. The bonding metal layer 250 may be formed of chrome, gold, or multiple layers thereof. Preferably, the bonding metal layer 250 may be formed by a typical deposition process, more preferably a thermal evaporation process.

A third photoresist pattern 255 is formed on the formed bonding metal layer 250. The third photoresist pattern 255 on the bonding metal layer 250 may be formed by a typical photolithography process. The third photoresist pattern 255 is formed to block the via block 230. Thus, the surface of the bonding metal layer 250, on which the via plug 230 is not formed, is exposed.

Figure 18:
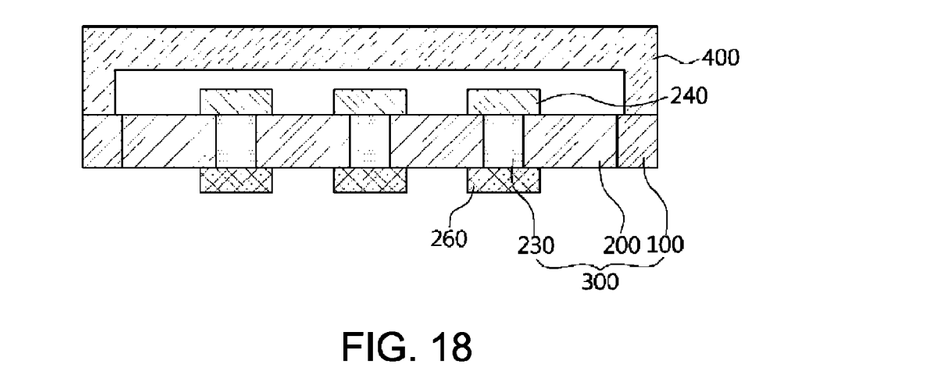

Referring to FIG. 18, an etch process is performed using the third photoresist pattern 255 as an etching mask. Thus, the bonding metal layer 250 other than the area covered by the third photoresist pattern 255 is removed, and the first substrate 100 and the second substrate 200 are partially exposed. Moreover, the bonding metal layer 250 electrically connected to the via plug 230 remains to form a bonding electrode 260. Then, the third photoresist pattern 255 is continuously removed to expose the remaining bonding electrode 260, thereby forming the substrate assembly 300 bonded to the protective substrate 400.

The formation of the bonding electrode 260 can be achieved by another method such as a plating process, for example.

Figure 19:
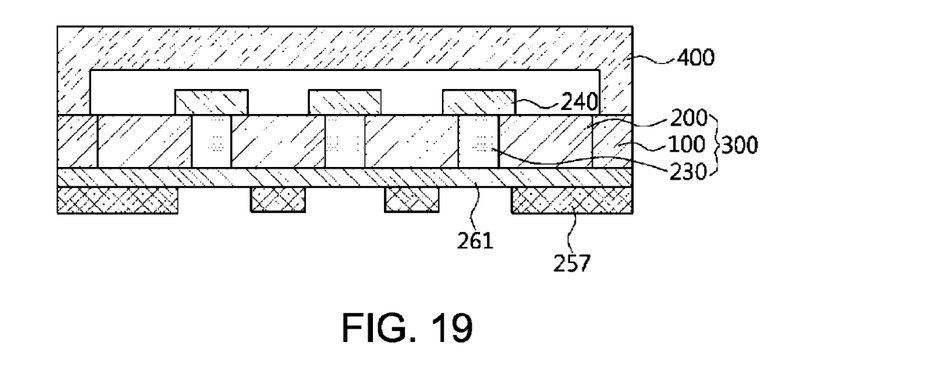

Referring to FIG. 19, a seed layer 261 is formed on the back side of the second substrate formed by the planarization process in FIG. 16. The seed layer 261 may be formed of chrome, gold, or multiple layers thereof. Preferably, the seed layer 261 may be formed by a typical deposition process, more preferably a thermal evaporation process.

A fourth photoresist pattern 257 is formed on the formed seed layer 261. The fourth photoresist pattern 257 on the seed layer 261 may be formed by a typical photolithography process. The fourth photoresist pattern 257 is formed to be open in the area where the via plug 230 penetrating the second substrate 200 is formed. Thus, the seed layer 261 formed on the via plug 230 is exposed.

Figure 20:
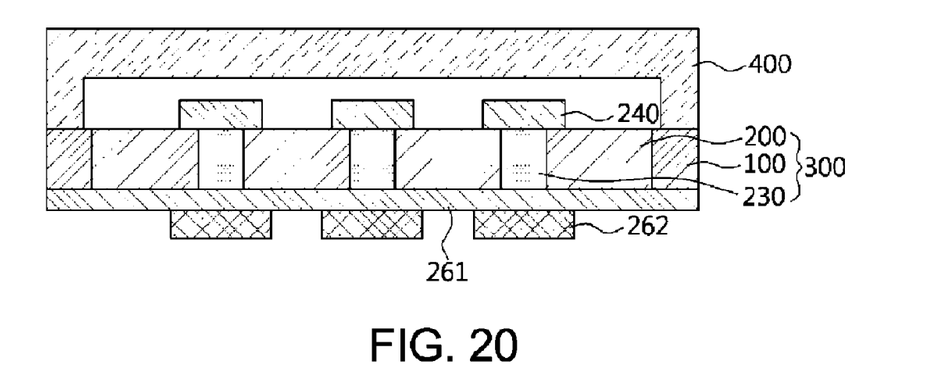

Referring to FIG. 20, a plating process is performed based on the exposed seed layer 261 and the fourth photoresist pattern 257. A typical plating process is used. As a result, a plating layer 262 is formed only on the exposed seed layer 261.

Subsequently, the fourth photoresist pattern 257 formed for the plating process is removed. Thus, only the plating layer 262 formed in the area corresponding to the via plug 230 remains on the seed layer 261.

Figure 21:
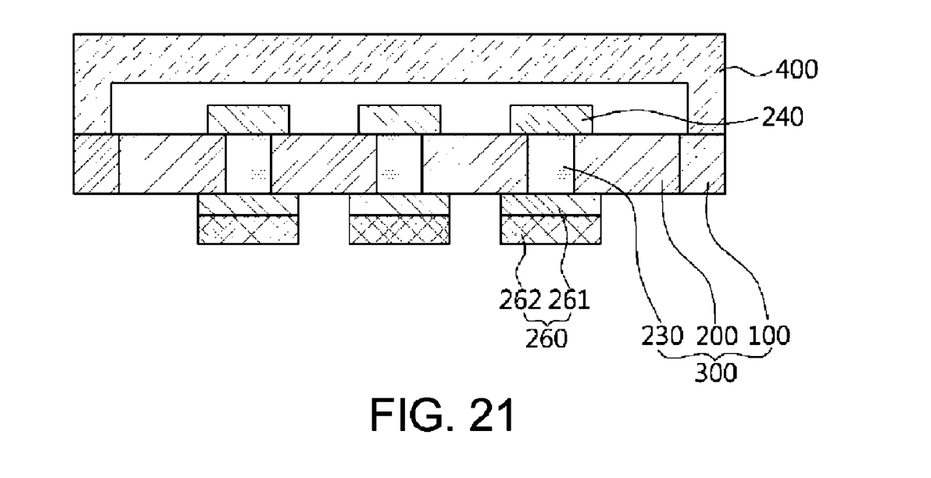

Referring to FIG. 21, the seed layer 261 on the bottom of the fourth photoresist pattern 257 shown in FIG. 19 is also removed. Preferably, the partial removal of the seed layer 261 may be performed by typical photography process and anisotropic dry etching process. The seed layer 261 and the plating layer 262, which are electrically connected to the via plug 230, are formed by the above-described processes. The seed layer 261 and the plating layer 262 form the bonding electrode 260. The bonding electrode 260 may be formed of chrome, gold, or multiple layers thereof, thereby forming the substrate assembly 300 bonded to the protective substrate 400.

Semiconductor devices or wires are provided on the second substrate formed of a non-conductive material such as glass through the above-described processes, and the remaining first substrate is bonded to the protective substrate. Moreover, the via plug penetrating the second substrate is formed and electrically connected to the semiconductor devices or wires.

Moreover, the bonding electrode formed on the back side of the second substrate is electrically connected to a separate wire.

According to the above-described present invention, the device packaging technique can be achieved by wafer-level packaging.

According to the present invention, the second substrate such as glass, etc. is reflowed to form a second pattern corresponding to a first pattern formed on a first substrate. The first pattern and the second pattern have concave-convex shapes corresponding to each other. Moreover, a portion of the first substrate projecting from the first pattern is removed. A via hole is formed in the second substrate by the partial removal of the first substrate. The via hole is filled with a conductive metal material by plating or deposition, thereby forming a via plug filled in the via hole of the second substrate. The via plug is electrically connected to the back side of the first substrate. A semiconductor device or metal wire is formed on the second substrate. The formed semiconductor device or metal wire is electrically connected to a bonding electrode formed on the back side of the second substrate through the via plug.

When the above-described electronic device package is applied to the packaging of RF MEMS devices, the loss of RF signal transmitted and received is minimized. The reason for this is that the substrate to which the electronic device or wire is applied is formed of non-conductive glass, and thus the coupling of RF signal transmission lines can be minimized.

In the present invention, the formation of the via plug is achieved by a plating process, for example, which allows the deposition of the conductive metal material without the presence of a separate seed layer, a diffusion barrier layer, or an additive. Therefore, superconformal electrodeposition in which no vacancy is formed can be performed, which simplifies the plating process, thereby substantially reducing the manufacturing cost of the electronic device package.

The through substrate structure and the electronic device package including the same can be applied to various device packages such as wafer-level packaging of RF MEMS devices, for example. That is, the through substrate structure and the electronic device package including the same can be applied as a low-cost and highly reliable packaging technique of next-generation ultra-high frequency devices such as high frequency phase modulators, frequency variable filters, impedance tuners, RF MEMS switches, etc. In the case of RF MEMS switches, the manufacturing cost incurred by the packaging occupies a significant portion of the entire price of the device. Moreover, the above devices are used as components of mobile communication terminals and serve as important elements. In the present invention, it is possible to reduce the increase in the manufacturing cost caused during the packaging of the RF MEMS devices. Moreover, the present invention can be applied as a generic technique for packaging of power MEMS devices, bio/medical MEMS, optical application MEMS devices, three-dimensional MEMS devices, etc.

As described above, according to the present invention, it is possible to manufacture the through substrate structure having a small pattern, a high aspect ratio, and a low surface roughness by performing a reflow process on the via hole formed by etching the first substrate, thereby reducing the size of the entire structure. For example, when the through substrate structure of the present invention is applied to the packaging of RF MEMS devices, it is possible to significantly reduce the loss of RF signal transmitted and received.

Moreover, when the plating process is performed on the via plug formed of metal, the deposition takes place from the bottom of the via hole without the presence of a separate seed layer, a diffusion barrier layer, or an additive, and thus superconformal electrodeposition in which no vacancy is formed can be performed, which simplifies the plating process, thereby substantially reducing the manufacturing cost of the device.

With the introduction of the process having the above-described advantages, it is possible to provide a through substrate structure having excellent structural and electrical properties and a device package using the same.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method for manufacturing a through substrate substructure, the method comprising:
    forming a first pattern having a concave-convex shape by selectively etching a first substrate;
    forming a second substrate having a second pattern which fills a space in the first pattern;
    forming a space in the second pattern by removing a projecting portion of the first pattern of the first substrate; and
    forming a via plug which fills the space in the second pattern.

2. The method of claim 1, wherein the forming of the second substrate having the second pattern comprises:
    disposing the second substrate on the first pattern of the first substrate;
    forming the second pattern, which fills the space in the first pattern, by reflowing the second substrate; and
    performing a planarization process on the second substrate such that a portion of the top of the first pattern of the first substrate is exposed and a portion of the second substrate formed based on the second pattern remains.

3. The method of claim 1, wherein the etching is not performed on an edge portion of the first substrate.

4. The method of claim 1, wherein the removing of the projecting portion of the first pattern is performed such that the first pattern forms a plane with the bottom of the second pattern.

5. The method of claim 1, wherein the forming of the via plug comprises:
    forming a seed layer on the back side of the first substrate;
    forming a protective film on the seed layer; and
    forming the via plug by filling the space in the second pattern with a conductive material by performing a plating process using the seed layer.

6. The method of claim 1, wherein the first substrate is a silicon substrate and the second substrate is a glass substrate.

* * * * *